United States Patent
Shim

(10) Patent No.: US 11,048,573 B2
(45) Date of Patent: Jun. 29, 2021

(54) DATA PROCESSING SYSTEM AND OPERATING METHOD THEREOF

(71) Applicant: SK hynix Inc., Gyeonggi-do (KR)

(72) Inventor: Eung-Bo Shim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 53 days.

(21) Appl. No.: 16/189,984

(22) Filed: Nov. 13, 2018

(65) Prior Publication Data
US 2019/0220341 A1    Jul. 18, 2019

(30) Foreign Application Priority Data

Jan. 12, 2018 (KR) .................. 10-2018-0004390

(51) Int. Cl.
| | |
|---|---|
| G06F 11/20 | (2006.01) |
| G11C 29/08 | (2006.01) |
| G06F 11/07 | (2006.01) |
| G11C 29/52 | (2006.01) |
| G06F 13/16 | (2006.01) |
| G11C 29/04 | (2006.01) |

(52) U.S. Cl.
CPC ........ *G06F 11/0787* (2013.01); *G06F 11/073* (2013.01); *G06F 11/079* (2013.01); *G06F 11/0751* (2013.01); *G06F 11/0775* (2013.01); *G06F 11/0781* (2013.01); *G06F 13/1668* (2013.01); *G11C 29/52* (2013.01); *G11C 2029/0411* (2013.01)

(58) Field of Classification Search
None
See application file for complete search history.

(56) References Cited

U.S. PATENT DOCUMENTS

| | | | |
|---|---|---|---|
| 7,065,624 B1 | 6/2006 | Zahavi | |
| 7,085,904 B2 | 8/2006 | Mizuno et al. | |
| 8,037,267 B2 | 10/2011 | Jinno et al. | |
| 8,645,610 B2 | 2/2014 | Chang et al. | |
| 8,775,988 B2 | 7/2014 | Lavin et al. | |
| 8,839,032 B2 * | 9/2014 | Walton ................ G06F 11/0712 709/224 |
| 8,954,698 B2 | 2/2015 | Schenfeld et al. | |
| 8,954,701 B2 | 2/2015 | Schenfeld et al. | |
| 9,104,586 B2 | 8/2015 | Schenfeld et al. | |
| 9,104,587 B2 | 8/2015 | Schenfeld et al. | |

(Continued)

FOREIGN PATENT DOCUMENTS

| | | |
|---|---|---|
| KR | 10-2005-0033060 | 4/2005 |
| KR | 10-2014-0078390 | 6/2014 |

(Continued)

OTHER PUBLICATIONS

DDR5 Full Spec Draft Rev0.5g, 2011, 1848.99A, JEDEC.

(Continued)

*Primary Examiner* — Phung M Chung
(74) *Attorney, Agent, or Firm* — IP & T Group LLP

(57) ABSTRACT

A data processing system includes a plurality of memory boards including a plurality of memory devices, and an error management controller that generates second error information based on plural pieces of first error information respectively received from each of the memory devices, and a memory error analysis device that analyzes the second error information received from the memory boards.

17 Claims, 9 Drawing Sheets

(56) References Cited

U.S. PATENT DOCUMENTS

| | | | |
|---|---|---|---|
| 9,110,818 B2 | 8/2015 | Schenfeld et al. | |
| 9,128,662 B2 | 9/2015 | Kim et al. | |
| 9,152,332 B2 | 10/2015 | Kopylovitz et al. | |
| 9,159,374 B2 | 10/2015 | Kim et al. | |
| 9,256,547 B2 | 2/2016 | Schenfeid et al. | |
| 9,390,047 B2 | 7/2016 | Schenfeid et al. | |
| 9,396,026 B2 | 7/2016 | Ichikawa et al. | |
| 9,442,854 B2* | 9/2016 | Hyde | G06F 12/0831 |
| 9,535,606 B2 | 1/2017 | Krithivas et al. | |
| 2004/0054776 A1* | 3/2004 | Klotz | H04L 41/06 |
| | | | 709/224 |
| 2006/0259621 A1 | 11/2006 | Ranganathan et al. | |
| 2008/0222348 A1 | 9/2008 | Mosek | |
| 2008/0309349 A1* | 12/2008 | Sutono | H04L 43/50 |
| | | | 324/537 |
| 2009/0037164 A1 | 2/2009 | Gaither et al. | |
| 2009/0249018 A1 | 10/2009 | Nojima et al. | |
| 2009/0276567 A1 | 11/2009 | Burkey | |
| 2010/0228956 A1* | 9/2010 | Sakamaki | G06F 11/0724 |
| | | | 712/225 |
| 2011/0041005 A1* | 2/2011 | Selinger | G06F 11/10 |
| | | | 714/719 |
| 2011/0231743 A1* | 9/2011 | Sakamaki | G06F 11/0724 |
| | | | 714/799 |
| 2012/0005556 A1 | 1/2012 | Chang et al. | |
| 2012/0179823 A1 | 7/2012 | Hatasak et al. | |
| 2012/0191964 A1 | 7/2012 | Lee et al. | |
| 2013/0107443 A1 | 5/2013 | Kim et al. | |
| 2013/0163175 A1 | 6/2013 | Kim et al. | |
| 2013/0275703 A1 | 10/2013 | Schenfeld et al. | |
| 2013/0275704 A1 | 10/2013 | Schenfeld et al. | |
| 2013/0275705 A1 | 10/2013 | Schenfeld et al. | |
| 2013/0275706 A1 | 10/2013 | Schenfeld et al. | |
| 2013/0275707 A1 | 10/2013 | Schenfeld et al. | |
| 2014/0006898 A1 | 1/2014 | Sharon et al. | |
| 2015/0106564 A1 | 4/2015 | Kopylovitz et al. | |
| 2015/0188649 A1* | 7/2015 | Buckler | G06F 1/10 |
| | | | 370/503 |
| 2015/0254108 A1 | 9/2015 | Kurtzman et al. | |
| 2015/0370697 A1 | 12/2015 | Schenfeld et al. | |
| 2016/0154755 A1 | 6/2016 | Schenfeld et al. | |
| 2016/0328156 A1 | 11/2016 | Swarbrick et al. | |
| 2018/0260158 A1 | 9/2018 | Marripudi et al. | |
| 2019/0310784 A1 | 10/2019 | Kim et al. | |

FOREIGN PATENT DOCUMENTS

| | | |
|---|---|---|
| KR | 1020160022242 | 2/2016 |
| KR | 1020160072890 | 6/2016 |
| KR | 1020160144560 | 12/2016 |
| KR | 10-2017-0066083 | 6/2017 |

OTHER PUBLICATIONS

Gen-Z-Core-Sperification—version-1.0, Feb. 13, 2016, pp. 1-983, GEN-Z Consortium.

Office Action issued by the USPTO for U.S. Appl. No. 16/674,935 dated May 11, 2021.

* cited by examiner

DATA PROCESSING SYSTEM AND OPERATING METHOD THEREOF

CROSS-REFERENCE TO RELATED APPLICATION

This application claims priority under 35 U.S.C. § 119 to Korean Patent Application No. 10-2018-0004390 filed on Jan. 12, 2018, which is incorporated herein by reference in its entirety.

BACKGROUND

1. Field

Various embodiments of the present invention relate to a data processing system. Particularly, the embodiments relate to a system and a method for substantially maintaining an error of data stored in a memory device.

2. Discussion of the Related Art

The computing environment paradigm has recently been shifting to ubiquitous computing, which enables computer systems to be used anywhere and anytime. Therefore, the use of portable electronic devices such as cellular phones, digital cameras, and notebook computers has rapidly increased. In general, such a portable electronic device uses a memory system using a memory device, in other words, a data storage device. The data storage device is used as a main storage device or an auxiliary storage device of the portable electronic device.

As the capacity of such a data storage device increases, an error frequently occurs in data stored in the data storage device. Accordingly, there has been increased demand for a method for collecting, analyzing, and substantially maintaining information on an error of the data stored in the data storage device.

SUMMARY

Various embodiments are directed to a system and a method for substantially maintaining an error of data stored in a memory device, and more particularly, to a method for collecting error information from the memory device and analyzing the error information.

In an embodiment, a memory system may include at least one memory board; and a memory error analysis device that analyzes first error information received from the at least one memory board, wherein the at least one memory board may include: a memory device including an error correction code (ECC) circuit, that stores data and correct an error of the stored data using the ECC circuit to output at least one second error information; and a memory board and error management controller that manages the second error information.

The first error information may include error information including the second error information.

The at least one memory board may further include a network device that outputs the second error information to the memory error analysis device.

The memory board and error management controller may include a memory error categorizer that parses and categorizes predetermined error information of error details constituting the second error information according to an error categorization criterion.

The error categorization criterion may include at least one of a type of a memory in which an error has occurred, a manufacturing company of the memory in which the error has occurred, an error count, an address of the memory in which the error has occurred, a temperature of a memory board when the error has occurred, and whether the error is a correctable error.

The memory board and error management controller may further include a memory error table that stores the predetermined error information.

The memory error analysis device may include a memory error categorizer that parses and categorizes predetermined error information of error information, which constitutes the first error information received from a memory board/error management controller of the at least one memory board, according to an error categorization standard.

The error categorization criterion may include at least one of a type of a memory in which an error has occurred, a manufacturing company of the memory in which the error has occurred, an error count, an address of the memory in which the error has occurred, a temperature of a memory board when the error has occurred, and whether the error is a correctable error.

The memory error analysis device may further include a memory error database that stores and substantially managing the predetermined error information.

The memory device may include a plurality of volatile memories, a plurality of nonvolatile memories, high capacity storages, or memory products in which different types of memories are provided.

The memory device may further include an error information transceiver that receives the second error information from the ECC circuit and transmit the second error information to the memory board and error management controller.

The memory board and error management controller may further include a display device that displays the predetermined error information stored in the memory error table.

In an embodiment, an operating method of a memory system may include managing first error information received from an error correction code (ECC) circuit of a memory device included in at least one memory board; and analyzing second error information received from the at least one memory board.

The first error information may include error information including the second error information.

The operating method of the memory system may further include outputting the second error information to a memory error analysis device through a network device.

The managing of the first error information may include parsing and categorizing predetermined error information of error details constituting the second error information according to an error categorization criterion.

The error categorization criterion may include at least one of a type of a memory in which an error has occurred, a manufacturing company of the memory in which the error has occurred, an error count, an address of the memory in which the error has occurred, a temperature of a memory board when the error has occurred, and whether the error is a correctable error.

The managing of the first error information may further include storing the predetermined error information in a memory error table.

The analyzing of the second error information may include parsing and categorizing predetermined error information of error information, which constitutes the first error information received from a memory board and error management controller of the at least one memory board, according to an error categorization criterion.

The error categorization criterion may include at least one of a type of a memory in which an error has occurred, a manufacturing company of the memory in which the error has occurred, an error count, an address of the memory in which the error has occurred, a temperature of a memory board when the error has occurred, and whether the error is a correctable error.

The analyzing of the second error information may further include storing and managing the predetermined error information.

The memory device may include a plurality of volatile memories, a plurality of nonvolatile memories, high capacity storages, or memory products in which different types of memories are provided.

In an embodiment, a data processing system may include a plurality of memory boards including a plurality of memory devices, and an error management controller that generates second error information based on plural pieces of first error information respectively received from each of the memory devices, and a memory error analysis device that analyzes the second error information received from the memory boards.

In an embodiment, an operating method of a data processing system may include generating, by a plurality of memory boards, second error information based on plural pieces of first error information respectively received from each of memory devices included in the memory boards, and analyzing, by a memory error analysis device, the second error information received from the memory boards.

In accordance with embodiments, it is possible to collect and substantially manage information on an error occurring in a memory device and further collect and substantially manage error information.

In accordance with embodiments, it is possible to analyze information on an error occurring in a memory board and utilize the information as information for an improved error management system.

In accordance with embodiments, large quantity of error information is efficiently managed, so that the error information can be utilized for developing a memory system.

DETAILED DESCRIPTION

Figure 1:
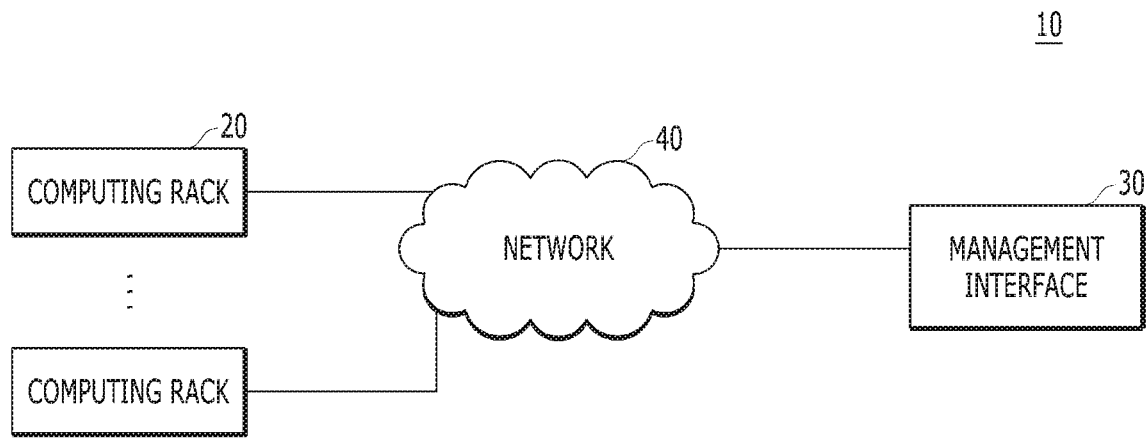
FIG. 1 is a diagram schematically illustrating an example of a data processing system including a memory system in accordance with an embodiment.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention. It is noted that reference to "an embodiment" does not necessarily mean only one embodiment, and different references to "an embodiment" are not necessarily to the same embodiment(s).

The terminology used herein is for the purpose of describing particular embodiments only and is not intended to be limiting of the present invention.

As used herein, singular forms may include the plural forms as well and vice versa, unless the context clearly indicates otherwise.

It is also noted, that in some instances, as would be apparent to those skilled in the relevant art, an element also referred to as a feature described in connection with one embodiment may be used singly or in combination with other elements of another embodiment, unless specifically indicated otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Hereinafter, the various embodiments of the present invention will be described in detail with reference to the attached drawings.

FIG. 1 is a diagram illustrating a data processing system 10. Referring to FIG. 1, the data processing system 10 may include a plurality of computing racks 20, a management interface 30, and a network 40 that enables communication between the computing racks 20 and the management interface 30. The data processing system 10 having such a rack scale architecture may be used, for example, a data center and the like for mass data processing.

Each of the plurality of computing racks 20 may implement one computing system through a combination with other computing racks 20. Detailed configuration and operation of such computing racks 20 will be described later.

The management interface 30 may provide an interactive interface by which a user may adjust, operate, or manage the data processing system 10. The management interface 30 may be implemented as any one type of compute device including a computer, a multiprocessor system, a server, a rack-mount server, a board server, a laptop computer, a notebook computer, a tablet computer, a wearable computing system, a network device, a web device, a distributed computing system, a processor-based system, and/or a consumer electronic device.

In various embodiments, the management interface 30 may be implemented by a distributed system having compute functions executable by the computing racks 20 or user interface functions executable by the management interface 30. In other embodiments, the management interface 30 may be implemented by a virtual server that is configured by distributed multiple computing systems through the network 40 and operates as a cloud. The management interface 30 may include a processor, an input/output sub-system, a memory, a data storage device, and a communication circuit.

The network 40 may perform data transmission and/or reception between the computing racks 20 and the management interface 30 and/or among the computing racks 20. The network 40 may be implemented by a predetermined number of various wired and/or wireless networks. For example, the network 40 may be implemented by a wired or wireless local area network (LAN), a wide area network (WAN) cellular network, and/or a publicly-accessible global network such as the Internet, or may include these networks.

In addition, the network 40 may include a predetermined number of auxiliary network devices such as auxiliary computers, routers, and switches. Furthermore, the network 40 may be electrically connected by an interface network such as cache coherent interconnect for accelerators (CCIX) and GEN-Z.

Figure 2:
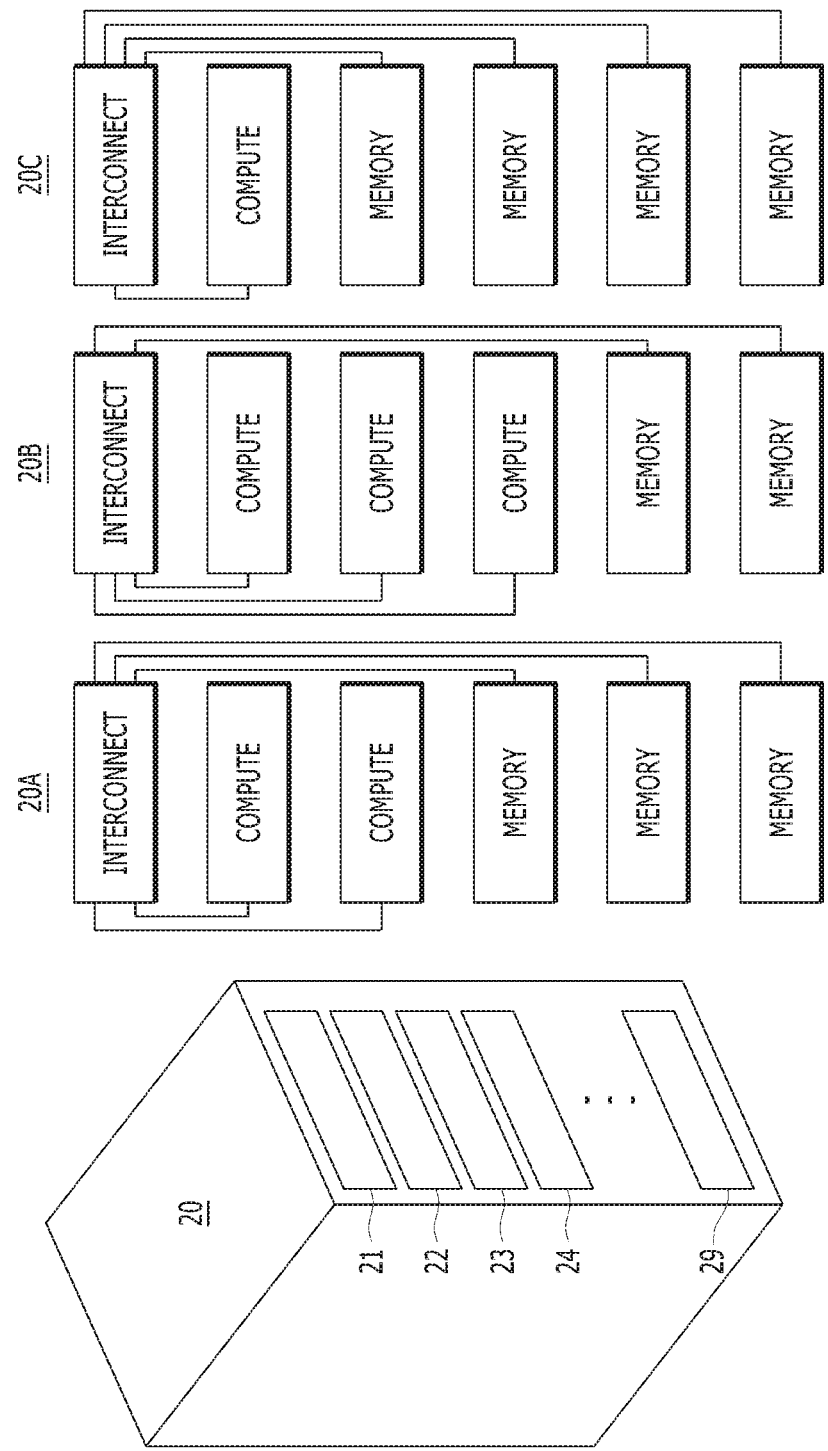
FIG. 2 is a diagram schematically illustrating an architecture of a computing rack in accordance with an embodiment.

FIG. 2 is a diagram schematically illustrating an architecture of a computing rack 20 in accordance with an embodiment. By way of example but not limitation, FIG. 2 illustrates three examples of computing racks 20: computing rack 20A, computing rack 20B, computing rack 20C.

Referring to FIG. 2, the computing rack 20 is not limited by a structure, a shape, a name, and the like of elements, and may include various types of elements depending on design. By way of example but not limitation, the computing rack 20 may include a plurality of drawers 21 to 29. Each of the plurality of drawers 21 to 29 may include a plurality of boards.

In various embodiments, the computing rack 20 may be implemented through a combination of a predetermined number of compute boards, memory boards, and/or interconnect boards. Herein, is it shown as an example that the computing rack 20 is defined to be implemented through a combination of a plurality of boards; however, it is noted that the computing rack 20 may be defined to be implemented in various other names such as drawers, modules, trays, chassis, and units, instead of boards. Elements of the computing rack 20 may have an architecture categorized and distinguished according to functions for the convenience of implementation. Although not limited thereto, the computing rack 20 may have an architecture categorized in order of the interconnect boards, the compute boards, and the memory boards from the top. Such a computing rack 20 and a computing system implemented by the computing rack 20 may be called a "rack scale system" or a "disaggregated system".

In various embodiments, the computing system may be implemented by one computing rack 20. However, the present invention is not limited thereto. For example, the computing system may be implemented by all elements included in two or more computing racks 20, a combination of some elements included in two or more computing racks 20, or some elements included in one computing rack 20.

In various embodiments, the computing system may be implemented through a combination of a predetermined number of compute boards, memory boards, and interconnect boards included in the computing rack 20. The predetermined number of compute boards, memory boards, and interconnect boards included in the computing rack 20 may vary according to the computing system design. For example, a computing system 20A may be implemented by two compute boards, three memory boards, and one interconnect board. In another example, a computing system 20B may be implemented by three compute boards, two memory boards, and one interconnect board. In yet another example, a computing system 20C may be implemented by one compute board, four memory boards, and one interconnect board.

Although FIG. 2 illustrates the case where the computing rack 20 is implemented through a combination of a predetermined number of compute boards, memory boards, and/or interconnect boards, the present invention is not limited thereto. For example, the computing rack 20 may include additional elements such as a power system, a cooling system, and input and/or output devices which may be found in a typical server and the like.

Figure 3:
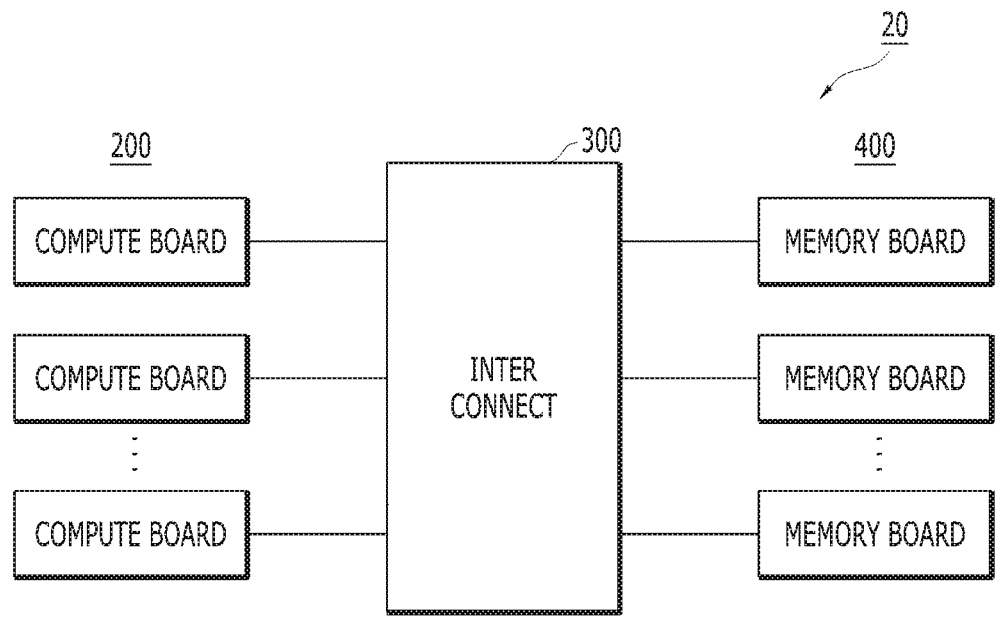
FIG. 3 is a block diagram illustrating a computing rack in accordance with an embodiment.

FIG. 3 is a diagram illustrating a computing rack 20 in accordance with an embodiment.

Referring to FIG. 3, the computing rack 20 may include a plurality of compute boards 200, a plurality of memory boards 400, and an interconnect board 300. The plurality of compute boards 200 may be called "pooled compute boards", "pooled compute systems," and the like. Similarly, the plurality of memory boards 400 may be called "pooled memory boards", "pooled memory systems, and the like. Herein, the computing rack 20 is defined to be implemented through a combination of a plurality of boards; however, it is noted that, instead, the computing rack 20 may be defined to be implemented in various other names such as drawers, modules, trays, chassis, and units.

Each of the plurality of compute boards 200 may include one or more processors, one or more processing/control circuits, or one or more processing elements such as central processing units (CPUs).

Each of the plurality of memory boards 400 may include various types of memories such as a plurality of volatile and/or nonvolatile memories. By way of example and not limitation, each of the plurality of memory boards 400 may include a plurality of dynamic random access memories (DRAMs), a plurality of flash memories, a plurality of memory cards, a plurality of hard disk drives (HDDs), a plurality of solid state drives (SSDs), and/or combinations thereof.

Each of the plurality of memory boards 400 may be divided, allocated, or designated by one or more processing elements included in each of the compute boards 200 according to the purpose of use. Furthermore, each of the plurality of memory boards 400 may store one or more operating systems (OSs) which may be initialized and/or executed by the compute boards 200.

The interconnect board 300 may be implemented by any one communication circuit and device, which may be divided, allocated, or designated by one or more processing elements included in each of the compute boards 200 for the purpose of use, or a combination thereof. For example, the interconnect board 300 may be implemented as any number of network interface ports, cards, or switches. The interconnect board 300 may use protocols for performing communication, which are related to one or more wired or wireless communication technologies. For example, the interconnect board 300 may support communication between the compute boards 200 and the memory boards 400 according to protocols such as peripheral component interconnect express (PCIe), QuickPath interconnect (QPI), and Ethernet. In addition, the interconnect board 300 may be electrically connected to the compute boards 200 by an interface standard such as cache coherent interconnect for accelerators (CCIX) and GEN-Z.

Figure 4:
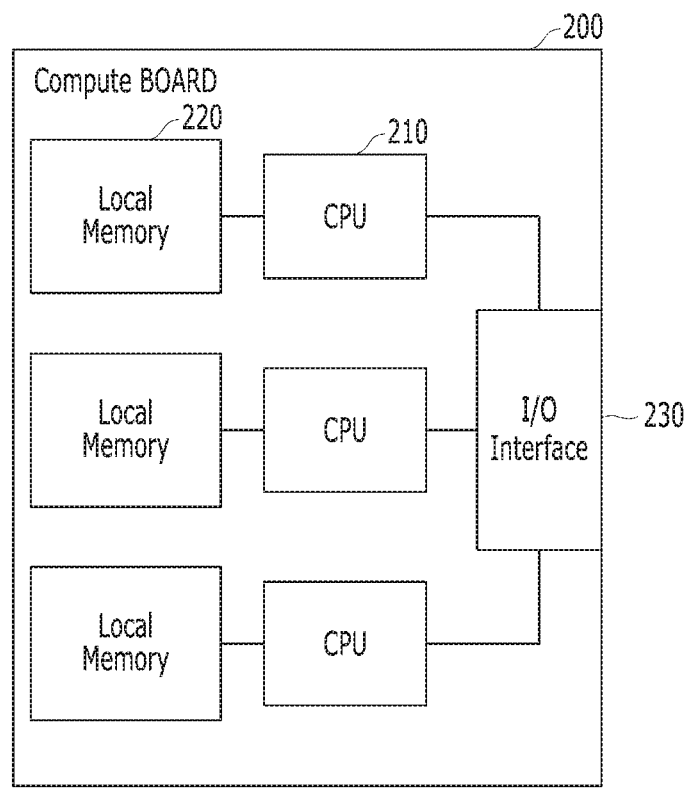
FIG. 4 is a diagram illustrating a compute board in accordance with an embodiment.

FIG. 4 is a diagram illustrating a compute board 200 in accordance with an embodiment.

Referring to FIG. 4, the compute board 200 may include one or more central processing units (CPUs) 210, one or more local memories 220, and an input/output (I/O) interface 230.

The CPU 210 may divide, allocate, or designate at least one memory board to be used among the plurality of memory boards 400 illustrated in FIG. 3. Furthermore, the CPU 210 may initialize the divided, allocated, or designated at least one memory board and perform a data read operation, write (or program) operation and the like through the at least one memory board.

The local memory 220 may store data required for performing the operations of the CPU 210. In various embodiments, one local memory 220 may have a structure corresponding to one CPU 210 in a one-to-one manner.

The I/O interface 230 may support interfacing between the CPU 210 and the memory boards 400 through the interconnect board 300 of FIG. 3. The I/O interface 230 may output transmission data to the interconnect board 300 from the CPU 210, and receive reception data to the CPU 210 from the interconnect board 300, by using protocols related to one or more wired or wireless communication technologies, and. For example, the I/O interface 230 may support communication between the CPU 210 and the interconnect board 300 according to protocols such as peripheral component interconnect express (PCIe), QuickPath interconnect (QPI), and Ethernet. In addition, the I/O interface 230 may support communication between the CPU 210 and the interconnect board 300 according to an interface standard such as cache coherent interconnect for accelerators (CCIX) and GEN-Z.

Figure 5:
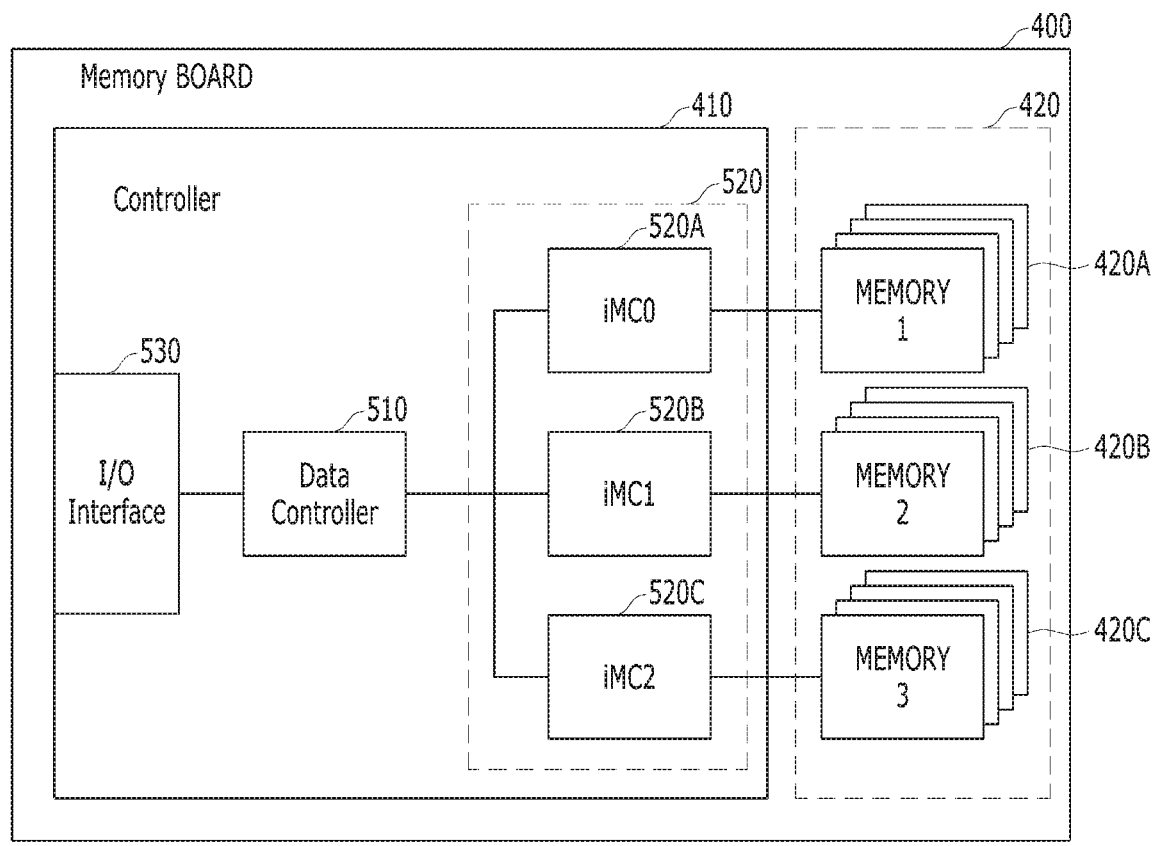
FIG. 5 is a diagram illustrating a memory board in accordance with an embodiment.

FIG. 5 is a diagram illustrating a memory board 400 in accordance with an embodiment.

Referring to FIG. 5, the memory board 400 may include a controller 410 and a plurality of memories 420. The plurality of memories 420 may store (or write) data therein and output (or read) the stored data under the control of the controller 410. The plurality of memories 420 may include a first group of memories 420A, a second group of memories 420B, and a third group of memories 420C. The first group of memories 420A, the second group of memories 420B, and the third group of memories 420C may have characteristics substantially equal to one another or may have characteristics different from one another. In various embodiments, the first group of memories 420A, the second group of memories 420B, and the third group of memories 420C may be memories having characteristics different from one another in terms of storage capacity or latency.

The controller 410 may include a data controller 510, memory controllers (MCs) 520, and an input/output (I/O) interface 530.

The data controller 510 may control data transmitted and/or received between the compute boards 200 and the plurality of memories 420 in FIG. 3. For example, in response to a write request or command, the data controller 510 may control a write operation for receiving data to be written from the compute boards 200 and writing the data in a corresponding memory of the plurality of memories 420. In another example, in response to a read request or command, the data controller 510 may control a read operation for reading data, which is stored in a specific memory of the plurality of memories 420, from the compute boards 200 and outputting the read data to a corresponding compute board of the compute boards 200.

The memory controllers 520 may be disposed between the data controller 510 and the plurality of memories 420, and may support interfacing therebetween. The memory controllers 520 may include a first memory controller (iMC0) 520A, a second memory controller (iMC1) 520B, and a third memory controller (iMC2) 520C respectively corresponding to the first group of memories 420A, the second group of memories 4203, and the third group of memories 420C included in the plurality of memories 420. The memory controller (iMC0) 520A may be disposed between the data controller 510 and the first group of memories 420A, and may support data transmission/reception therebetween. The memory controller (iMC1) 520B may be disposed between the data controller 510 and the second group of memories 420B, and may support data transmission/reception therebetween. The memory controller (iMC2) 520C may be disposed between the data controller 510 and the third group of memories 420C, and may support data transmission/reception therebetween. For example, when the third group of memories 420C are flash memories, the memory controller (iMC2) 520C may be a flash controller. The first to third group of memories 420A to 420C are for illustrative purposes only and the embodiment is not limited thereto.

The I/O interface 530 may support interfacing between the data controller 510 and the compute boards 200 through the interconnect board 300 of FIG. 3. The I/O interface 530 may output transmission data to the interconnect board 300 from the data controller 510 and receive reception data to the data controller 510 from the interconnect board 300 by using protocols related to one or more wired or wireless communication technologies. For example, the I/O interface 530 may support communication between the data controller 510 and the interconnect board 300 according to protocols such as peripheral component interconnect express (PCIe), QuickPath interconnect (QPI), and Ethernet. In addition, the I/O interface 530 may support communication between the data controller 510 and the interconnect board 300 according to an interface standard such as cache coherent interconnect for accelerators (CCIX) and GEN-Z.

As described above, a server system or a data processing system such as a future data center may have an architecture in which a plurality of boards including compute boards, memory boards, storage boards and the like are distinctively mounted in a unit rack. In this case, one memory board may include a plurality of memories having characteristics different from one another in order to satisfy various user workloads. That is, one memory board may be a convergence memory device in which a plurality of memories such as DRAMs, PCRAMs, MRAMs, STT-RAMs, and flash memories are converged. In such a convergence memory device, since the memories characteristics different from one another, it may be utilized for various usage models.

Hereinafter, with reference to FIG. 6A to FIG. 6C, FIG. 7A and FIG. 7B, and FIG. 8, a data processing system capable of collecting and analyzing error information on data stored in a memory device and an operating method thereof will be described in more detail.

Figure 6A:
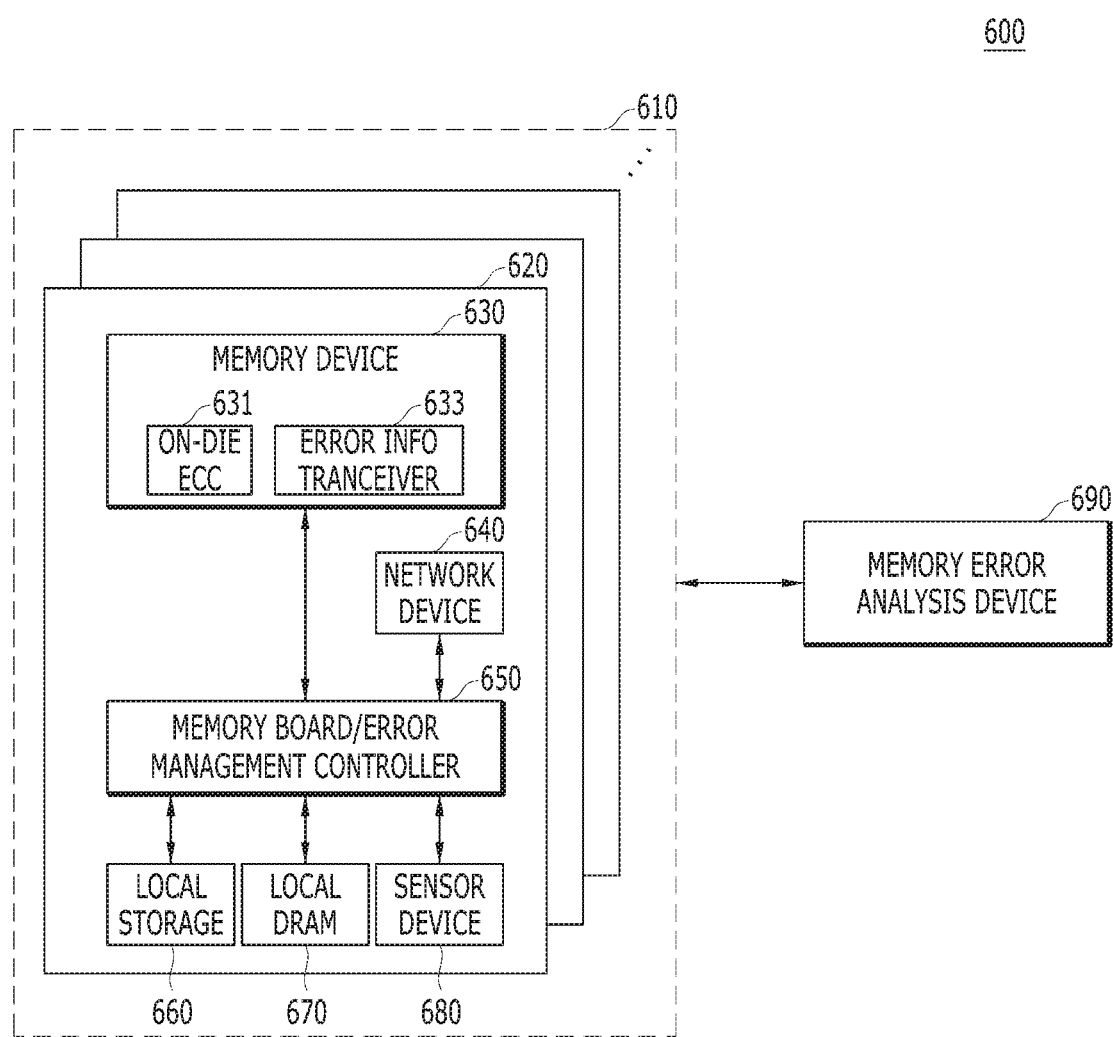
FIG. 6A is a diagram illustrating a data processing system in accordance with an embodiment.

FIG. 6A illustrates a data processing system 600 for analyzing a memory error in accordance with an embodiment. Referring to FIG. 6A, the data processing system 600 may include a memory board set 610 and a memory error analysis device 690.

The memory board set 610 may include a plurality of memory boards 620. The present disclosure describes a single memory board set 610 by way of example and for convenience; however, the memory board set 610 may include a plurality of memory board sets. The memory board set 610 may correspond to the plurality of memory boards 400 described with reference to FIG. 3.

The memory board 620 may include a plurality of memory devices 630, a local storage 660, a local dynamic random access memory (DRAM) 670, a sensor device 680, a network device 640, and an error management controller 650.

The memory device 630 may be defined as a storage device that stores data. The memory device 630 will be described as a single memory device for convenience; however, the memory board 620 may include two or more memory devices 630.

For example, the memory device 630 may be defined as a set of single NAND flash memory. Furthermore, the memory device 630 may also be defined as a set of a plurality of nonvolatile memories such as NAND flash memories, a plurality of volatile memories such as DRAMs, or memory products in which memory devices different from one another and different types of memories are provided inclusive of high capacity storages. That is, the scope of the present invention should be interpreted regardless of the type and number of memories constituting the memory device 630.

Each of the memory devices 630 may include an on-die error correction code (ECC) circuit 631 and an error information transceiver 633.

The on-die ECC circuit 631 may correct an error of data stored in the memory device 630. A method, in which the on-die ECC circuit 631 corrects an error of data stored in the memory device 630, may be performed by various ECC algorithms including a Hamming code and the like. In accordance with an embodiment, the on-die ECC circuit 631 included in each of the memory devices 630 may generate first error information.

In an embodiment, the on-die ECC circuit 631 may generate the first error information in a predetermined format.

In accordance with an embodiment, the memory board 620 may include an error management controller 650 that collects and categorizes the first error information received from each of the memory devices 630. Therefore, the error management controller 650 may increase reliability of the memory board 620 by using the collected first error information.

The error information transceiver 633 may receive the error information from the on-die ECC circuit 631 and transmit the error information to the error management controller 650.

In this case, the memory device 630 may include the local storage 660 and the local DRAM 670, that is, the memory device 630 may be a device that stores data.

That is, if the local storage 660 and the local DRAM 670 is included in the memory device 630, the on-die ECC circuit 631 of the memory device 630 may correct an error of data stored in the local storage 660 and the local DRAM 670. Furthermore, the memory device 630 may transmit error information on data stored in the local storage 660 and the local DRAM 670 to the error management controller 650 through the error information transceiver 633.

In addition to the local storage 660 and the local DRAM 670, all devices capable of storing data may be included in the memory device 630.

The error management controller 650 may collect the first error information through the on-die ECC 631 circuit included in each of the memory devices 630. Furthermore, the error management controller 650 may control the local storage 660, the local DRAM 670, the sensor device 680, and a display device (not illustrated).

The local storage 660 may perform storing the first error information output from the error management controller 650. As described above, the local storage 660 may be included in the memory device 630.

The local DRAM 670 may temporarily store data related to the memory board 620. As described above, the local DRAM 670 may be included in the memory device 630.

The sensor device 680 may include at least one sensing device capable of sensing the state of the memory board 620. In an embodiment, the sensor device 680 may sense the temperature of the memory board 620 and operate a cooling system (not illustrated) according to the temperature.

The on-die ECC circuit 631 may correct an error of data stored in the memory device 630. The error management controller 650 may receive the first error information generated by the on-die ECC circuit 631 through the error information transceiver 633.

The first error information generated by the on-die ECC circuit 631 may include error details such as a type of a memory in which the error has occurred, a manufacturing company of the memory in which the error has occurred, an address of the memory in which the error has occurred, a temperature of a memory board when the error has occurred, and whether the error is a correctable error.

In an embodiment, the address of the memory is raw address of the memory board 620.

In an embodiment, the address of the memory is system address of compute board 200.

The error management controller 650 may categorize the first error information generated by the on-die ECC circuit 631 according to an error categorization criterion, and manage the categorized error information. For example, the error management controller 650 may categorize the first error information according to the error categorization criterion such as an error occurrence position, and a temperature of a memory board when an error has occurred, and manage the categorized error.

Furthermore, the error management controller 650 may collect not only the first error information on the data stored in the memory device 630, but also information on an error occurred in other data storage device (e.g. the local storage 660, the local DRAM 670 and the like) included in the memory board 620.

The error management controller 650 extract error details from the first error information, and organize the error details to generate second error information.

The network device 640 may transmit the second error information to the memory error analysis device 690.

The network device 640 may communicate with the memory error analysis device 690 through a wired and/or wireless communication device. Such a wired and/or wireless communication device may include all communication devices that transmit data.

The network device 640 may operate similarly to the function of the I/O interface 530 described with reference to FIG. 5.

Specifically, the network device 640 may output transmission data to the memory error analysis device 690 from the error management controller 650 and receive reception data to the error management controller 650 from the memory error analysis device 690 by using protocols related to one or more wired or wireless communication technologies.

For example, the network device 640 may support communication between the error management controller 650 and the memory error analysis device 690 according to protocols such as peripheral component interconnect express (PCIe), QuickPath interconnect (QPI), and Ethernet.

In addition, the network device 640 may support communication between the error management controller 650 and the memory error analysis device 690 according to an interface standard such as cache coherent interconnect for accelerators (CCIX) and GEN-Z.

The memory error analysis device 690 may receive the second error information on each of the memory boards 620 included in the memory board set 610, which is generated by the error management controller 650, and analyze the second error information.

Furthermore, the memory error analysis device 690 may analyze the second error information.

The error management controller 650 may manage the operation of the memory board 620. Also, the error management controller 650 may manage an error occurring in the memory device 630. Furthermore, the error management controller 650 may manage all operations of devices related to the basic operation of the memory board 620.

For example, the memory board 620 may include a cooler or cooling system (not illustrated) capable of adjusting the temperature of the memory board 620. The error management controller 650 may adjust the temperature of the memory board 620 by using the cooler.

Furthermore, the memory board 620 may include a display device (not illustrated) capable of performing substantially the same role as that of a display device 655 included in the error management controller 650, as will be described in FIG. 6B later.

The error management controller 650 may visually provide information on the memory board 620 to a user through the display device 655.

Figure 6B:
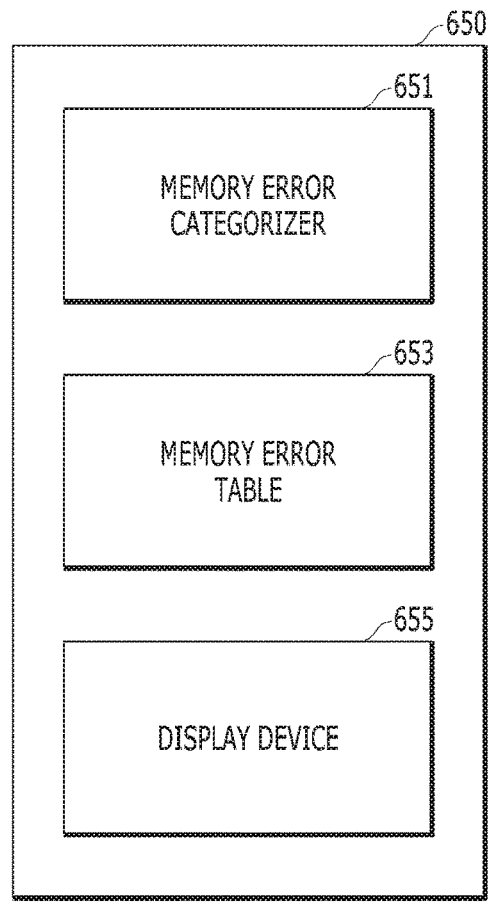
FIG. 6B is a diagram illustrating an error management controller in accordance with an embodiment.

FIG. 6B illustrates the error management controller 650 in accordance with an embodiment. Referring to FIG. 6B, the error management controller 650 may include a memory error categorizer 651, a memory error table 653, and the display device 655.

The memory error categorizer 651 may receive the first error information, extract error details constituting the first error information, and categorize the error details. In various embodiments, the memory error categorizer 651 may categorize the error details according to at least one error categorization criterion through a parsing operation for extracting only error details required for a user from a plurality of error details constituting the error information.

The error information may include the information on an error occurred in the data storage device included in the memory board 620, as well as the first error information on the data stored in the memory device 630. For example, the error information may indicate information on an error occurring in all the sub-storage devices (e.g., the local storage 660, the local DRAM 670 and the like) capable of constituting the memory board 620.

The error categorization criterion, for example, may include a type of a memory in which an error has occurred, an error count occurred in one memory, a manufacturing company of the memory in which the error has occurred, an address of the memory in which the error has occurred, a temperature of a memory board when the error has occurred, or whether the error is a correctable error. Such an error categorization criterion is not limited to the aforementioned example and may include any and all various error categorization criterions according to error details constituting error information.

In accordance with an embodiment, the memory error categorizer 651 may operate according to at least one error categorization criterion. For example, the memory error categorizer 651 may extract at least one error details from the first error information according to the error categorization criterion.

When the memory error categorizer 651 operates according to the type of the memory in which an error has occurred, the memory error categorizer 651 may extract information on the type of the memory from a plurality of error details constituting the error information through the parsing operation, and store the extracted information in the memory error table 653. The display device 655 may display the error information stored in the memory error table 653.

When the memory error categorizer 651 operates according to the address of the memory in which the error has occurred, the memory error categorizer 651 may extract information on the address of the memory from the plurality of error details constituting the error information through the parsing operation, and store the extracted information in the memory error table 653. The display device 655 may display the error information stored in the memory error table 653.

When the memory error categorizer 651 operates according to the temperature of the memory board when the error has occurred, the memory error categorizer 651 may extract information on the temperature of the memory board from the plurality of error details constituting the error information through the parsing operation, and store the extracted information in the memory error table 653. The display device 655 may display the error information stored in the memory error table 653.

When the memory error categorizer 651 operates according to whether the error is a correctable error, the memory error categorizer 651 may extract information indicating whether the error is a correctable error from the plurality of error details constituting the error information through the parsing operation, and store the extracted information in the memory error table 653. The display device 655 may display the error information stored in the memory error table 653.

In addition to the aforementioned example, the memory error categorizer 651 may extract information corresponding to a criterion set by a user from the plurality of error details constituting the error information through the parsing operation according to the criterion set by the user, and store the extracted information in the memory error table 653. The display device 655 may display the error information stored in the memory error table 653.

Furthermore, the memory error categorizer 651 may also categorize the error details by a plurality of error categorization criterions set by a user. For example, the memory error categorizer 651 may set "whether the error is a correctable error" and "the temperature of the memory board when the error has occurred" as the error categorization criterion. The memory error categorizer 651 may categorize the error details received therein as a correctable error and a non-correctable error according to whether the error is a correctable error. The memory error categorizer 651 may additionally parse error count information only for the correctable error and store the information in the memory error table 653.

Figure 6C:
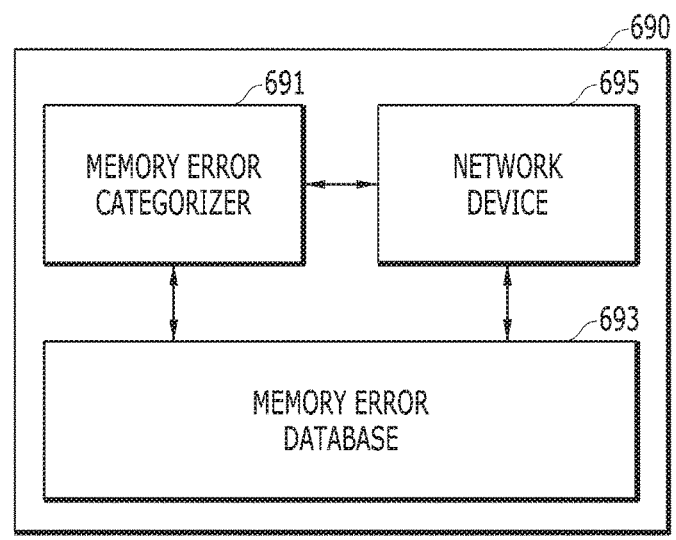
FIG. 6C is a diagram illustrating a memory error analysis device in accordance with an embodiment.

FIG. 6C illustrates a memory error analysis device 690 in accordance with an embodiment.

Referring to FIG. 6C, the memory error analysis device 690 may include a memory error categorizer 691, a memory error database 693, and a network device 695.

The memory error analysis device 690 may operate based on Hadoop® which is a Java-based software framework that supports a distributed application operating in a large-scale computer cluster capable of processing mass material. The Hadoop® is just one example capable of implementing the memory error analysis device 690. All platforms capable of implementing the memory error analysis device 690 including Hadoop® may be applied to the present invention. In other words, it is noted that the scope of the present invention is not limited to a memory error analysis device based on Hadoop®.

The memory error analysis device 690 may receive the second error information from a data system 600 including the plurality of memory boards 620 through the network device 695, and analyze the second error information.

The memory error categorizer 691 may receive the second error information from the memory boards 620, extract error details constituting the second error information, and categorize the error details according to an error categorization criterion, similar to the operation of the memory error categorizer 651 described with reference to FIG. 6B. And the memory error categorizer 691 may analyze the categorized error details.

The error information may include the information on an error occurred in the data storage device included in the memory board 620, as well as the error information on the data stored in the memory device 630. For example, the error information may indicate information on an error occurring in all the sub-storage devices (e.g., the local storage 660, the local DRAM 670 and the like) capable of constituting the memory board 620.

In various embodiments, the memory error categorizer 691 may categorize the detailed error information according to the at least one error categorization criterion. For example, the memory error categorizer 691 may categorize the error details through a parsing operation for extracting only error details required for a user of the data processing system 600 from a plurality of error details constituting the error information.

In an embodiment, the memory error categorizer 691 may operate according to at least one error categorization criterion. For example, the memory error categorizer 691 may extract at least one error details corresponding the error categorization criterion, from the second error information received from the at least one memory board 620.

The error categorization criterion, for example, may be one of a type of a memory in which an error has occurred, a manufacturing company of the memory in which the error has occurred, an address of the memory in which the error has occurred, a temperature of a memory board when the error has occurred, or whether the error is a correctable error. Such an error categorization criterion is not limited to the aforementioned example and may include any and all various error categorization criterions according to error details constituting error information.

When the memory error categorizer 691 operates according to the type of the memory in which an error has occurred, the memory error categorizer 691 may extract information on the type of the memory from a plurality of error details constituting the error information through the parsing operation, and store the extracted information in the memory error database 693. When the memory error categorizer 691 operates according to the error count occurred in one memory, the memory error categorizer 691 may extract error count information from the plurality of error details constituting the error information through the parsing operation, and store the extracted information in the memory error database 693.

When the memory error categorizer 691 operates according to the address of the memory in which the error has occurred, the memory error categorizer 691 may extract information on the address of the memory from the plurality of error details constituting the error information through the parsing operation, and store the extracted information in the memory error database 693.

When the memory error categorizer 691 operates according to the temperature of the memory board when the error has occurred, the memory error categorizer 691 may extract information on the temperature of the memory board from the plurality of error details constituting the error information through the parsing operation, and store the extracted information in the memory error database 693.

In addition to the aforementioned example, the memory error categorizer 691 may extract error details corresponding to the at least one error categorization criterion set by a user from the second error information through the parsing operation. And the memory error categorizer 691 may store the error details in the memory error database 693.

The network device 695 may receive the second error information through the network device 640 of each of the memory boards 620.

The network device 695 may communicate with the network device 640 of each of the memory boards 620 through a wired and/or wireless communication device. Such a wired and/or wireless communication device may include all communication devices that transmit data.

The network device 695 may operate similarly to the function of the I/O interface 530 described with reference to FIG. 5.

Specifically, the network device 695 may output transmission data to the error management controller 650 from the memory error analysis device 690. Also, the network device 695 may receive reception data to the memory error analysis device 690 from the error management controller 650. The network device 695 may output transmission data and receive reception data by using protocols related to one or more wired or wireless communication technologies.

For example, the network device 695 may support communication between the error management controller 650 and the memory error analysis device 690 according to protocols such as peripheral component interconnect express (PCIe), QuickPath interconnect (QPI), and Ethernet.

In addition, the network device 695 may support communication between the error management controller 650 and the memory error analysis device 690 according to an interface standard such as cache coherent interconnect for accelerators (CCIX) and GEN-Z.

Figure 7A:
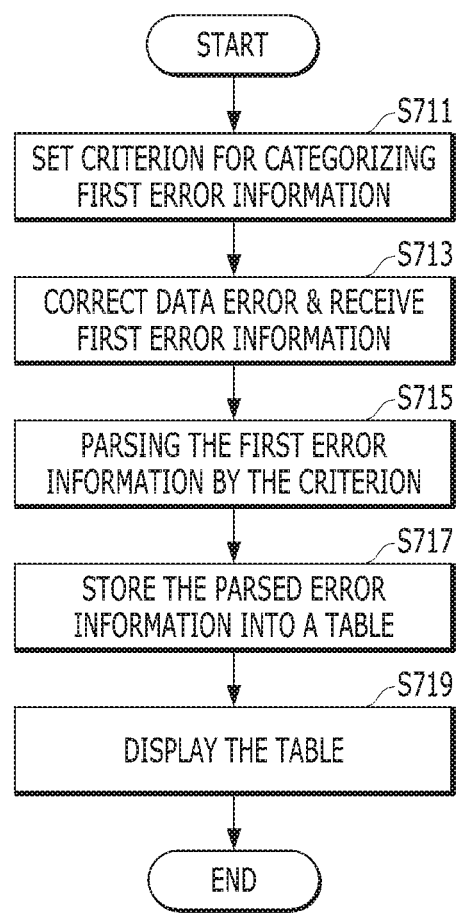
FIGS. 7A and 7B are flowcharts illustrating operations of a memory error management device in accordance with an embodiment.

FIG. 7A is a flowchart illustrating the operating process of the error management controller 650 as described with reference to FIGS. 6A to 6C.

At step S711, at least one error categorization criterion may be set. The memory error categorizer 651 included in the error management controller 650 may operate according to the error categorization criterion.

At step S713, the on-die ECC circuit 631 may correct an error of data stored in the memory device 630. And the on-die ECC circuit 631 may generate the first error information including error details. The error management controller 650 may receive the first error information.

At step S715, the memory error categorizer 651 may parse the first error information by the error categorization criterion. Specifically, the memory error categorizer 651 may parse the first error information. And the memory error categorizer 651 may extract at least one error details from the parsed error information corresponding to the error categorization criterion.

At step S717, the memory error categorizer 651 may store the error details in the memory error table 653.

In an embodiment, the memory error categorizer 651 may categorize the error details according to the error categorization criterion and store the error details in the memory error table 653.

In an embodiment, the memory error categorizer 651 may generate second error information by organizing the error details. And the memory error categorizer 651 may transmit the second error information to the memory error analysis device 690.

At step S719, the display device 655 may display the error details stored in the memory error table 653.

In an embodiment, the memory error categorizer 651 may count the error number of the respective memory devices 630 based on error details on the address of the memory in which the error has occurred. And the memory error categorizer 651 may detect whether one among the error numbers exceeds a threshold value. And the memory error categorizer 651 may control the display device 655 to display a signal to inform the user to replace the memory device 630.

Meanwhile, if the error of data stored in the memory device 630 is uncorrectable error, the uncorrectable error causes failure of the memory device 630. Therefore, if an uncorrectable error occurs, it may be necessary to shut down the memory board 620 and replace the memory device 630.

Figure 7B:
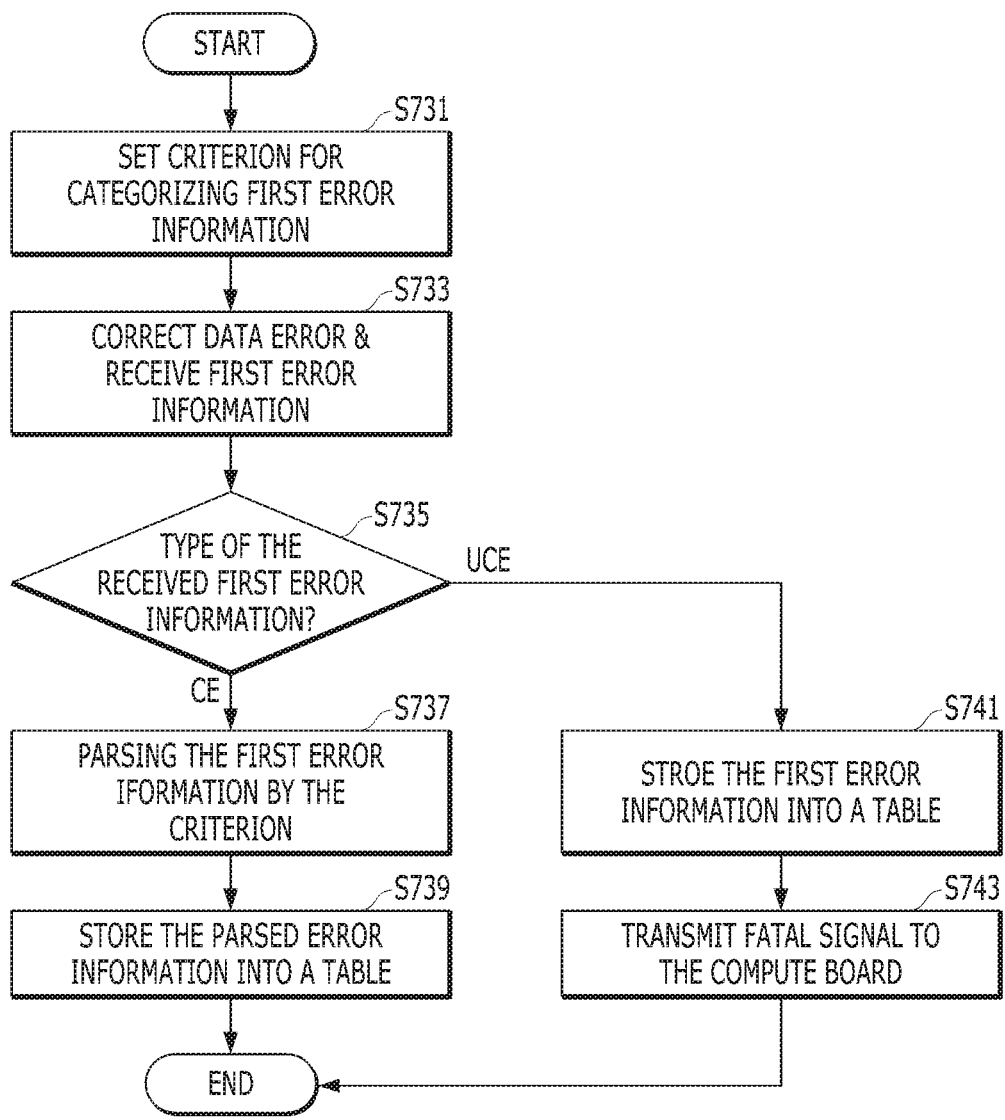

FIG. 7B is a flowchart illustrating the operating process of the error management controller 650 with reference to FIGS. 6A to 6C.

At step S731, at least one of error categorization criterion may be set. The memory error categorizer 651 included in the error management controller 650 may operate according to the the error categorization criterion.

At step S733, the on-die ECC circuit 631 may correct an error of data stored in the memory device 630. And the on-die ECC circuit 631 may generate different type of first error information according to whether the error is a correctable error. The error management controller 650 may receive first error information on the data in which the error has occurred.

At step S735, the memory error categorizer 651 may determine the type of the first error information.

When the first error information is correctable error information CCE at the step S735), the memory categorizer 651 may parse the first error information by the error categorization criterion at step S737. Specifically, the memory error categorizer 651 may parse the first error information. And the memory error categorizer 651 may extract at least one error details from the parsed error information corresponding to the error categorization criterion.

At step S739, the memory error categorizer 651 may store the error details in the memory error table 653.

When the first error information is uncorrectable error information ('UCE' at the step S735), the memory error categorizer 651 may store the first error information at step S741.

In an embodiment, the data processing system 600 may include the compute board 200 described with reference to FIG. 4.

At step S743, the memory error categorizer 651 may transmit fatal signal to the compute board 200. In response to a fatal signal, the compute board 200 may shut down the memory board 620.

In an embodiment, the memory error categorizer 651 may parse the first error information after the memory board 620 booted up.

Figure 8:
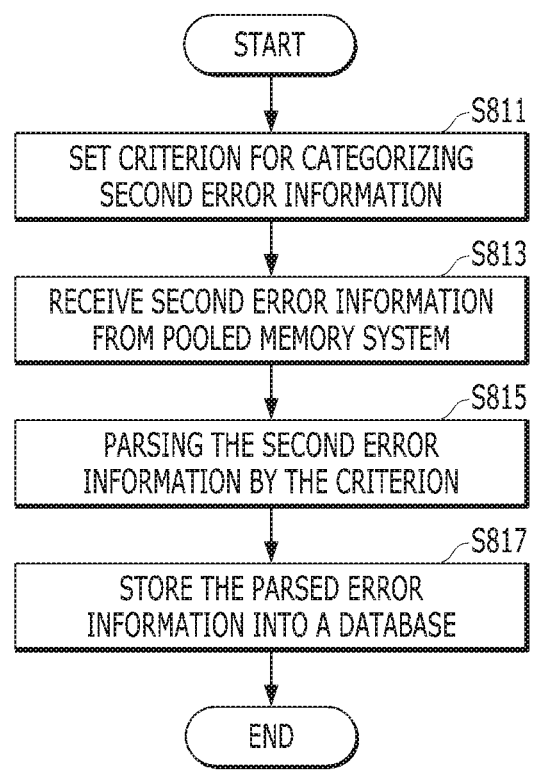
FIG. 8 is a flowchart illustrating an operation of a memory error analysis device in accordance with an embodiment.

FIG. 8 is a flowchart illustrating the operating process of the memory erroranalysis device 690 as described with reference to FIGS. 6A to 6C.

The memory error analysis device 690 may operate based on Hadoop® which is a Java-based software framework that supports a distributed application operating in a large-scale computer cluster capable of processing mass material. Hadoop® is just one example capable of implementing the memory error analysis device 690. All platforms capable of implementing the memory error analysis device 690, including Hadoop®, may be applied to the present invention. In other words, it is noted that the scope of the present invention is not limited to a memory error analysis device based on Hadoop®.

At step S811, at least one error categorization criterion may be set. The memory error categorizer 691 included in the memory error analysis device 690 may operate according to the error categorization criterion. Specifically, the error categorization criterion may be set by a user of the memory error analysis device 690. Alternatively, the error categorization criterion may be set by the data processing system 600 in advance in correspondence to a predetermined criterion and operation environment.

At step S813, the memory error analysis device 690 may receive second error information from the memory board set 610 of the pooled memory system. Specifically, the network device 695 of the memory error analysis device 690 may receive the second error information through the network device 640 of each of the memory boards 620.

At step S815, the memory error categorizer 691 may parse the second error information by the error categorization criterion. Specifically, the memory error categorizer 691 may parse the second error information. And the memory error categorizer 691 may extract at least one error details from the parsed error information corresponding to the set error categorization criterion. Then, the memory error categorizer 691 may categorize the error details according to the error categorization criterion.

At step S817, the memory error categorizer 691 may store the categorized error information in the memory error database 693.

In an embodiment, the memory error categorizer 691 may analyze the error details stored in the memory error database 693 by using a MapReduce framework. Specifically, the memory error categorizer 691 may filter and sort the error details. And the memory error categorizer 691 may summarize the sorted error details. Therefore, the memory error categorizer 691 may use the summarized error information for improve reliability of the data processing system 600.

In accordance with an embodiment described with references to FIGS. 6A to 6C, FIGS. 7A and 7B, and FIG. 8, it is possible to collect the first error information on an error of data stored in the memory devices 630, and extract and categorize error details from information constituting the first error information.

Furthermore, in accordance with an embodiment, it is possible to collect the second error information from the memory board set 610, and extract, categorize and analyze the error details from information constituting the second error information.

Although various embodiments have been described for illustrative purposes, it will be apparent to those skilled in the art that various changes and modifications may be made without departing from the spirit and scope of the invention as defined in the following claims.

What is claimed is:

1. A data processing system comprising:
    a plurality of memory boards each including:
        a plurality of memory devices, and
        an error management controller configured to generate second error information based on plural pieces of first error information respectively received from each of the memory devices;
    a memory error analysis device configured to analyze the second error information received from the memory boards and use the analyzed second error information for improve reliability of the data processing system; and
    a plurality of compute boards configured to control the memory boards,
    wherein one of the memory boards provides signal to one of the compute boards according to the first error information that is uncorrectable error information,
    wherein the compute board shuts down the memory board in response to the signal, and
    wherein the shutdown memory board parses the first error information during booting of the shutdown memory board for generating the second error information.

2. The data processing system of claim 1, wherein the error management controller extracts at least one error details from the first error information according to at least one error categorization criterion, and generates the second error information including the error details.

3. The data processing system of claim 2, wherein the error categorization criterion is one of a type of a memory in which error has occurred, a manufacturing company of the memory in which the error has occurred, an address of the memory in which the error has occurred, a temperature of a memory system when the error has occurred, and whether the error is a correctable error.

4. The data processing system of claim 2, wherein the error management controller categorizes the error details according to the error categorization criterion, and stores the categorized error details in a memory error table.

5. The data processing system of claim 4, wherein the memory board include display device configured to display the stored error details.

6. The data processing system of claim 5, wherein the error management controller counts the error number of the respective memory devices based on the stored error details, and controls the display device to display a signal according to whether one among the error number exceeds a threshold value.

7. The data processing system of claim 1, the memory error analysis device extracts at least one error details from the second error information according to at least one error categorization criterion, categorizes the error details according to the error categorization criterion, and stores the categorized error information in an internal memory error database.

8. The data processing system of claim 7, wherein the memory error analysis device analyzes by filtering and sorting the error details and summarizing the sorted error details.

9. The data processing system of claim 7, wherein the error categorization criterion is one of a type of a memory in which error has occurred, a manufacturing company of the memory in which the error has occurred, an address of the memory in which the error has occurred, a temperature of a memory system when the error has occurred, and whether the error is a correctable error.

10. An operating method of a data processing system, comprising:
    generating, by a plurality of memory boards, second error information based on plural pieces of first error information respectively received from each of memory devices included in the memory boards;
    analyzing, by a memory error analysis device, the second error information received from the memory boards;
    providing, by one of the memory boards, signal to one of the compute boards included in the data processing system, according to the first error information that is uncorrectable error information;
    shutting down, by the compute board, the memory board;
    parsing, by the shutdown memory board, the first error information during booting of the shutdown memory board for generating the second error information; and
    using the analyzed second information for improve reliability of the data processing system.

11. The operating method of the data processing system of claim 10, wherein the generating the second error information comprises extracting at least one error details from the first error information according to at least one error categorization criterion, and generating the second error information including the error details.

12. The operating method of the data processing system of claim 11, wherein the error categorization criterion is one of a type of a memory in which error has occurred, a manufacturing company of the memory in which the error has occurred, an address of the memory in which the error has occurred, a temperature of a memory system when the error has occurred, and whether the error is a correctable error.

13. The operating method of the data processing system of claim 11, further comprising:
    categorizing, by the memory boards, the error details according to the error categorization criterion; and
    storing, by the memory boards, the categorized error details in a memory error table.

14. The operating method of the data processing system of claim 10, further comprising:
    counting, by the memory boards, the error number of the respective memory devices based on the stored error details; and
    controlling, by the memory boards, an internal display device to display a signal according to whether one among the error number exceeds a threshold value.

15. The operating method of the data processing system of claim 10, further comprising:
    extracting, by the error analysis device, at least one error details from the second error information according to at least one error categorization criterion;
    categorizing, by the error analysis device, the error details according to the error categorization criterion; and
    storing, by the error analysis device, the categorized error information in an internal memory error device.

16. The operating method of the data processing system of claim 15, wherein the analyzing the second error information comprises filtering and sorting the error details, and summarizing the sorted error details.

17. The operating method of the data processing system of claim 16, wherein the error categorization criterion is one of a type of a memory in which error has occurred, a manufacturing company of the memory in which the error has occurred, an address of the memory in which the error has occurred, a temperature of a memory system when the error has occurred, and whether the error is a correctable error.

* * * * *